(12) United States Patent
Solomko et al.

(10) Patent No.: US 12,301,216 B2
(45) Date of Patent: May 13, 2025

(54) RF SERIES SWITCH ARRANGEMENT WITH SWITCHING TIME ACCELERATION

(71) Applicant: Infineon Technologies AG, Neubiberg (DE)

(72) Inventors: Valentyn Solomko, Munich (DE); Semen Syroiezhin, Erlangen (DE)

(73) Assignee: INFINEON TECHNOLOGIES AG, Neubiberg (DE)

(*) Notice: Subject to any disclaimer, the term of this patent is extended or adjusted under 35 U.S.C. 154(b) by 98 days.

(21) Appl. No.: 18/463,680

(22) Filed: Sep. 8, 2023

(65) Prior Publication Data

US 2025/0088183 A1 Mar. 13, 2025

(51) Int. Cl.
*H03K 17/041* (2006.01)
*H03K 17/081* (2006.01)

(52) U.S. Cl.
CPC .. *H03K 17/04106* (2013.01); *H03K 17/08104* (2013.01)

(58) Field of Classification Search
CPC ......... H03K 17/04123; H03K 17/0412; H03K 17/04; H03K 17/00; H03K 17/102; H03K 17/10; H03K 2217/0054; H03K 2217/00
See application file for complete search history.

(56) References Cited

U.S. PATENT DOCUMENTS

| | | | |
|---|---|---|---|
| 10,044,349 B2* | 8/2018 | Scott | H03K 17/693 |
| 2017/0272066 A1 | 9/2017 | Scott et al. | |
| 2018/0167062 A1 | 6/2018 | Shanjani et al. | |
| 2019/0296726 A1 | 9/2019 | Kolcuoglu et al. | |
| 2021/0265990 A1 | 8/2021 | Luo | |
| 2023/0238952 A1 | 7/2023 | Syroiezhin et al. | |

FOREIGN PATENT DOCUMENTS

WO 2022197510 A1 9/2022

* cited by examiner

*Primary Examiner* — Diana J. Cheng
(74) *Attorney, Agent, or Firm* — Slater Matsil, LLP

(57) ABSTRACT

An RF switch arrangement includes a shunt switch having a first RF terminal, a second RF terminal coupled to ground, a main control input, and an acceleration control input; a series switch having a first RF terminal coupled to the first RF terminal of the shunt switch, a second RF terminal, a main control input, and an acceleration control input; and a switching time acceleration circuit having a positive acceleration path input, a negative acceleration path input, and a first output coupled to the main control input of the series switch.

20 Claims, 15 Drawing Sheets

RF SERIES SWITCH ARRANGEMENT WITH SWITCHING TIME ACCELERATION

TECHNICAL FIELD

The present invention relates generally to an RF series switch arrangement with switching time acceleration and, in particular embodiments, to a corresponding method for switching time acceleration.

BACKGROUND

Antenna tuning switches are used in cell phones to adjust the properties of the antenna. The switches are implemented as series stacked MOS transistors. Series connection is required to achieve high voltage handling at RF frequencies that are generated at the antenna. The switch is connected between the feed of an antenna and planar front-end electronics or coupled between the integrated antenna and the system ground plane. An important parameter of the switchable element is the switching time, which defines what time it takes for the switch to become fully opened or fully closed. This time defines when the RF signal can be applied to the antenna. Evolution of the cellular standards indicate a need for switching time reduction. This requirement is caused, particularly by increasing number of frequency bands and the need for fine tuning capabilities.

The limitation in decreasing the switching time comes from the RC network that must be charged to open or close the switch. The RC network consists of the resistor in series with the gate terminal of each switch and the gate-source/gate-drain capacitance. The RC time constant cannot be made smaller for the following two reasons. The gate-source/gate-drain capacitance has to be high to keep the drains/sources well defined when RF signal is applied and the switch is opened (meaning, operating in OFF-state). The resistor in series with the gate terminal is required to define the DC voltage of the gate terminal. This resistor has to be high to keep the high impedance of the gate. High impedance is required to minimize influence of the DC biasing voltages on the gate voltage at high frequencies when RF signal is present and the switch is opened. Power losses in the switch are inversely proportional to the bias resistors of the circuit.

Therefore, there is a tradeoff between the switching speed and RF performance of the switch. A challenge for improving switching performance is to quickly recharge the gates of the switch without decreasing the RC time constant in the high ohmic state of the switch. The tradeoff is especially strong in high-stacked antenna tuning switches, where the RC time constant cannot be easily reduced without severe degradation of power losses and substantial distortion of voltage division inside the MOSFET stack.

SUMMARY

According to an embodiment, an RF switch arrangement comprises a shunt switch having a first RF terminal, a second RF terminal coupled to ground, a main control input, and an acceleration control input; a series switch having a first RF terminal coupled to the first RF terminal of the shunt switch, a second RF terminal, a main control input, and an acceleration control input; and a switching time acceleration circuit having a positive acceleration path input, a negative acceleration path input, and a first output coupled to the main control input of the series switch.

According to an embodiment, an RF switch arrangement comprises a shunt switch having a first RF terminal, a second RF terminal coupled to ground, a main control input, a main control output, an acceleration control input, and an acceleration control output; a series switch having a first RF terminal coupled to the first RF terminal of the shunt switch, a second RF terminal, a main control input, and an acceleration control input; and a shunt-series switch coupled between the main control output of the shunt switch and the main control input of the series switch, and coupled between the acceleration control output of the shunt switch and the acceleration control input of the series switch.

According to an embodiment, a method of operating an RF switch arrangement, wherein the RF switch arrangement comprises a series switch including a first switching time acceleration circuit, a shunt switch including a second switching time acceleration circuit, and a shunt-series switch for selectively coupling the series switch to the shunt switch, wherein the method comprises establishing a conductive path during a switching transient and an OFF-state operational mode of the series switch; and breaking the conductive path during an ON-state operational mode of the series switch.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same or similar elements have been designated by corresponding references in the different drawings if not stated otherwise.

A switching time acceleration implementation for shunt high-voltage RF switches is shown and described in co-pending patent application Ser. No. 17/648,849 entitled "RF Switch with Switching Time Acceleration," which is hereby incorporated by reference in its entirety. While the implementation in the '849 patent application demonstrates excellent results for shunt switches, it is not directly applicable for series switches as well be discussed in further detail below. The switching time acceleration of the '849 patent application is shown and described briefly below with respect to FIGS. 1A, 1B, 1C and 1D.

Figures 1A, 1B:
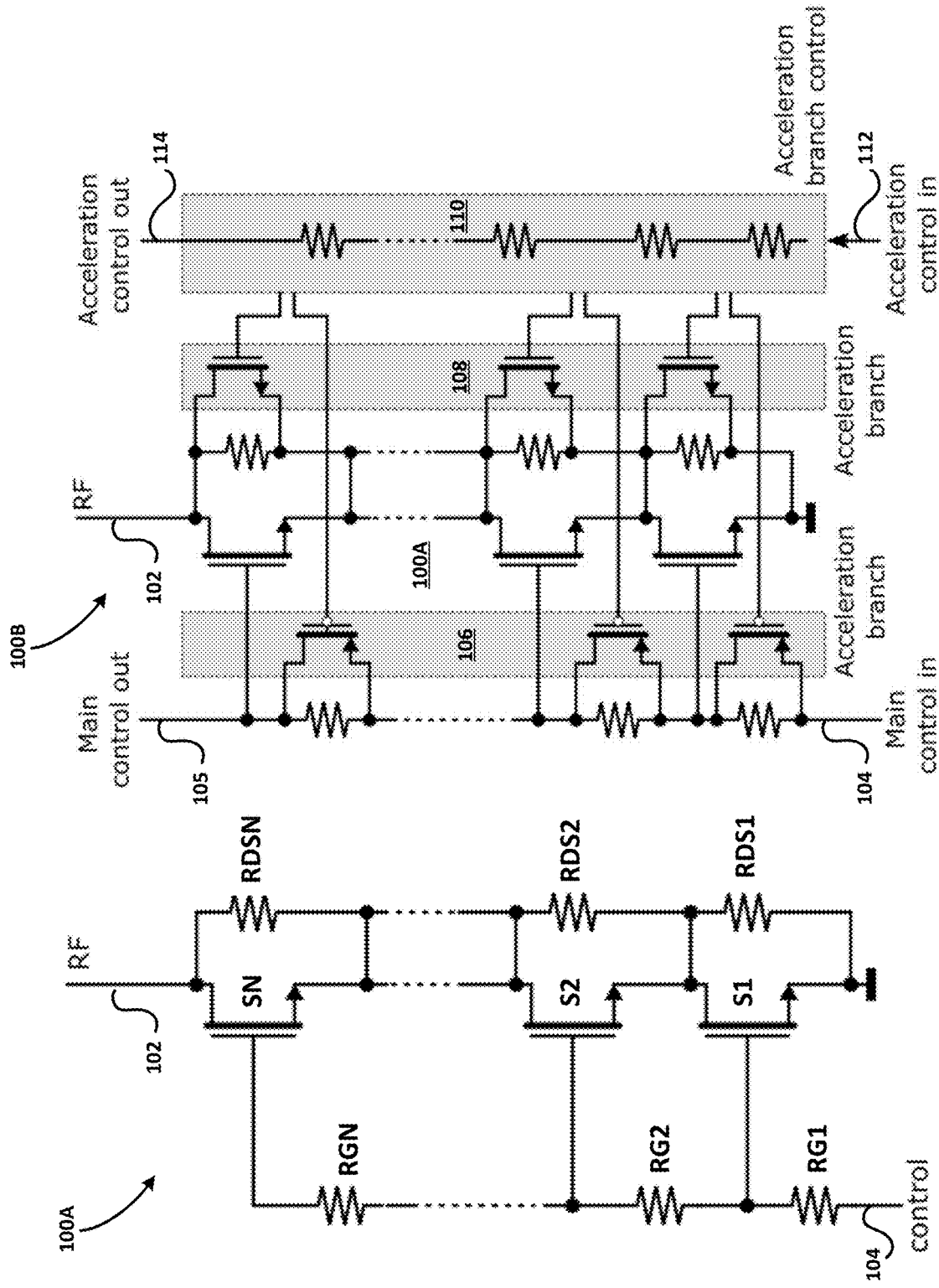
FIG. 1A is a schematic diagram of a shunt RF switch using conventional resistive biasing.
FIG. 1B is a schematic diagram of an exemplary shunt RF switch with switching time acceleration.

FIG. 1A is a schematic diagram of a shunt RF switch 100A using conventional resistive biasing. Shunt RF switch 100A is a shunt switch coupled between an RF source 102 and ground, comprising a plurality of stacked NMOS transistors S1, S2, . . . , and SN. While only three such transistors are shown in FIG. 1A, those skilled in the art will realize that any number of such transistors can be used based on the semiconductor technology used and the high voltage requirements demanded by a specific application. Shunt RF switch 100A includes a plurality of drain-to-source resistors RDS1, RDS2, . . . , and RDSN, wherein a single drain-to-source resistor is coupled across the drain to source of the corresponding NMOS transistor. Shunt RF switch 100A also includes a plurality of gate resistors RG1, RG2, . . . , and RGN coupled to the gate of each corresponding NMOS transistor. Resistor RG1 receives a control signal at a control input node 104 for operating shunt RF switch 100A. When the control signal at control input node 104 is low, shunt RF switch 100A is OFF. Conversely, when the control signal at control input node 104 is high, shunt RF switch 100A is ON.

FIG. 1B is a schematic diagram of an exemplary shunt RF switch 100B with switching time acceleration. Shunt RF switch 100B includes all of the components of shunt RF switch 100A, but with the resistor and transistor labels omitted. In addition, shunt RF switch 100B includes an acceleration branch 106 comprising a plurality of PMOS transistors for selectively shorting the gate resistors, an acceleration branch 108 comprising a plurality of NMOS transistors for selectively shorting the drain-to-source resistors, and an acceleration branch control network 110 for providing a control signal to acceleration branch 106 and to acceleration branch 108. In shunt RF switch 100B, the gate resistors are coupled between the main control input node 104 and a main control output node 105. The drain-to-source resistors are coupled between RF source 102 and ground.

Figure 1C:
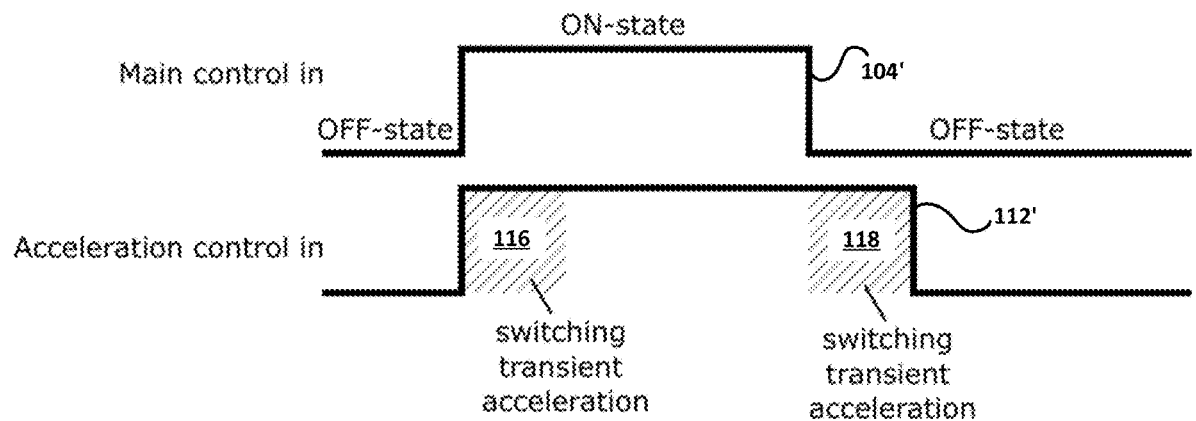
FIG. 1C is a timing diagram including the time-domain waveforms for controlling the main and acceleration branches of the exemplary shunt RF switch shown in FIG. 1B.

FIG. 1C is a timing diagram including the time-domain waveforms for controlling the main and acceleration branches of the exemplary shunt RF switch 100B shown in FIG. 1B. The control waveform 104' for the main control input node 104 is used for switching the main branch of shunt RF switch 100B (RF switch 100A) between an OFF state to an ON state, and then back from the ON state to the original OFF state. The acceleration control input waveform 112' for the acceleration control input node 112 for the acceleration branch 106 and acceleration branch 108 is operational during a first switching transient acceleration 116 associated with the rising edge of the control waveform, and during a second switching transient acceleration 118 associated with the falling edge of the control waveform signal 112' coupled to node 112.

Figure 1D:
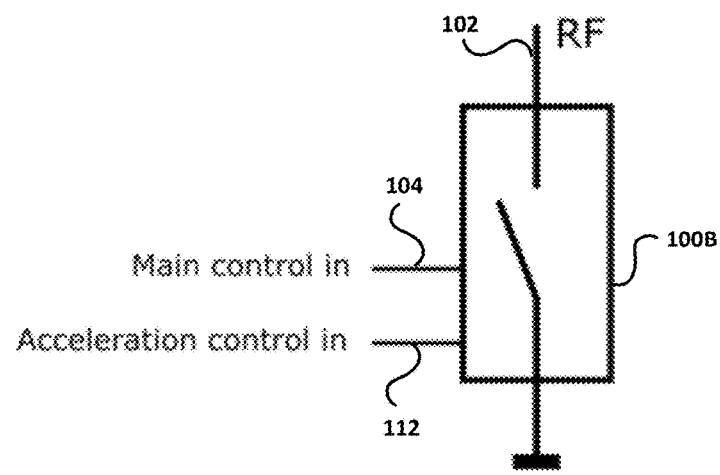
FIG. 1D shows a symbolic representation of the exemplary shunt RF switch shown in FIG. 1B.

FIG. 1D shows a symbolic representation of the exemplary shunt RF switch 100B shown in FIG. 1B coupled to RF source 102, main control input node 104, acceleration control input node 112, and a ground node.

Thus, embodiments of the present invention are partly based upon the switching time acceleration implementation shown and described in the '849 patent application. The conceptual circuit diagram of the '849 application is demonstrated in FIG. 1B, which improves the switching time of a conventional shunt switch with series resistive biasing in FIG. 1A by adding acceleration branches 106 and 108 based on switches (e.g. PMOS and NMOS transistors) shorting the resistors in the gate and drain-source bias networks during the switching transient. The control of the acceleration branches 106 and 108 is performed by an acceleration branch control network 110 based on high-ohmic resistors following the stack configuration of the shunt RF switch 100A and fed from the cold side (i.e. grounded side) of the switch. The acceleration switches are enabled for a short time at the beginning of a "change state" command for the shunt RF switch 100A and disabled after the switching transient has been completed. The time-domain waveforms for controlling the main and acceleration branches are demonstrated in FIG. 1C. The circuit shown in FIG. 1B is not directly applicable to series switches for the reason that it does not address the problem of feeding control signals (denoted as "main control in" at control input node 104 and "acceleration control in" at acceleration control input node 112) if one of the two poles of the switch is not shorted to ground, but instead is coupled between two RF sources.

The configuration of shunt RF switch 100B implies that the control nodes 104 and 112 are directly coupled to a low-voltage, low-ohmic control circuit. If the grounded input of the switch is exposed to a high RF voltage (which is a typical operating mode of a series switch), then a high RF voltage drop over the bottom-most devices (i.e. the lowest resistor and the lowest PMOS connected to control node 104) of the acceleration branch control network would occur. In turn, this would result in high power losses or even a reliability risk. In order to enable the grounded input of shunt RF switch 100B to be exposed to a high RF voltage, the control signal must be applied via a high-ohmic impedance path to allow nodes 104 and 112 be exposed to a similar high-voltage level as the switch input itself.

Figure 2A:
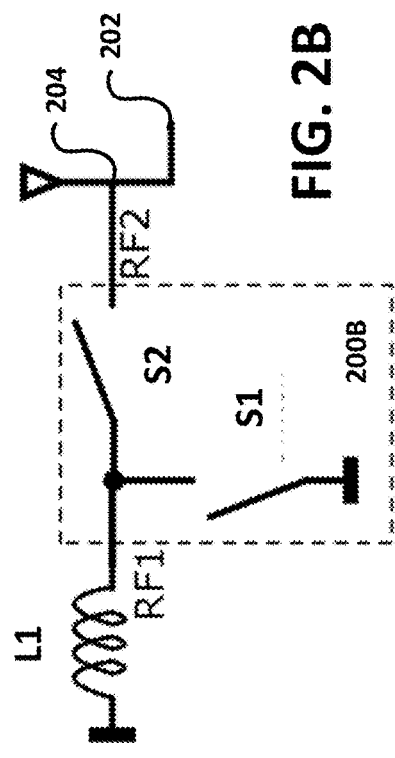
FIGS. 2A, 2B, 2C, and 2D are application RF switch examples for antenna tuning including a shunt switch in combination with a series switch.
Figure 2B:
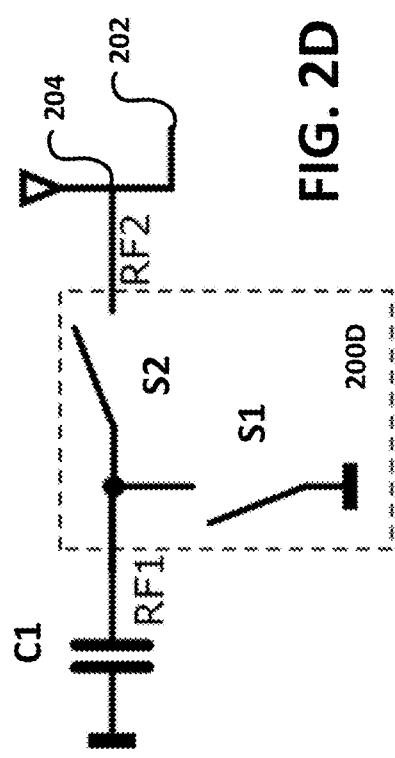
Figure 2C:
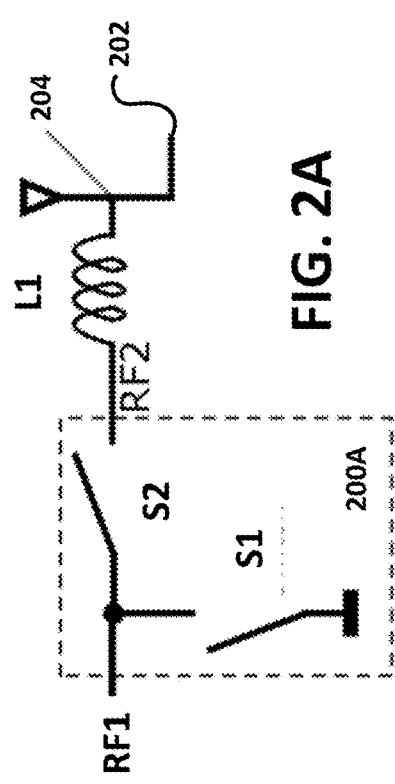
Figure 2D:
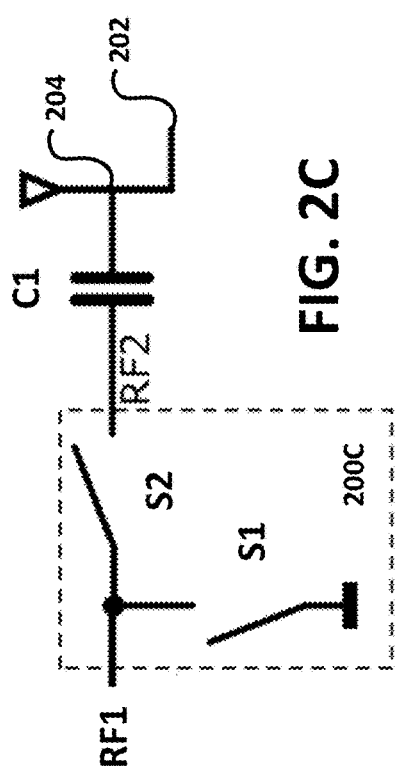

FIGS. 2A, 2B, 2C, and 2D are application RF switch examples for antenna tuning including a shunt switch in combination with a series switch. FIGS. 2A, 2B, 2C, and 2D include a shunt switch S1 coupled between a first RF source RF1 and ground, and a series switch S2 coupled between the first RF source RF1 and a second RF source RF2. The second RF source RF2 is directly or indirectly coupled to an antenna and an antenna feed 202 at node 204. In FIG. 2A an inductor Li is coupled between the second RF source RF2 and node 204. In FIG. 2B the inductor Li is coupled between the first RF source RF1 and ground. In FIG. 2C a capacitor C1 is coupled between the second RF source RF2 and node 204. In FIG. 2D the capacitor C1 is coupled between the first RF source RF1 and ground.

According to embodiments, the switch branch in the RF series switching arrangement comprises at least one series switching branch and may comprise a shunt branch, which in a default configuration remains in an OFF state during RF operation. The shunt switch can serve the purpose of ESD protection of the series branch as is known in the art. The shunt switch serves in some embodiments as a path for transferring the control signal from the controller to the series switch as will be described in further detail below.

The use of the series switch with switching time acceleration according to embodiments is not limited to any particular application. However, the series switch including switching time acceleration has particular advantages in a main target application of RF antenna tuning. Several antenna tuning application examples are portrayed in the FIGS. 2A, 2B, 2C, and 2D, described above. In all cases a reactive component (capacitor or inductor) is coupled to the antenna aperture tuning point via the series switch. In some cases (where the inductor is directly coupled to ground, as in FIG. 2B) the shunt switch may be closed when the series switch is in OFF state in order to short the inductor to ground. This will prevent unwanted series resonance formed by the inductor and the capacitance of the OFF state series switch at high frequencies.

In a first group of embodiments the shunt switch S1 and the series switch S2 both comprise an RF switch with switching time acceleration as shown in FIG. 1B. However, in order to remedy the problems set forth above using a direct substitution of this circuit into the series switch S2, an additional time acceleration circuit is used. The additional switching time acceleration circuit comprises two additional switches and a diode circuit. The diode circuit limits the functionality of each additional switch to only charging the main control input 104 or only discharging the main control input 104. The additional switching time acceleration block can be partially merged with the shunt switch S1, according to an embodiment. The operation and advantages of the partially merged embodiment are discussed below, particularly with respect to the description of FIG. 7. The additional switching time acceleration block solves the direct substitution problem by providing a low-ohmic impedance path between a controller and the main control input 104 of the series switch S2 via the additional switching time acceleration circuit. The low-ohmic impedance path is provided during the switching phase of the switch arrangement (i.e., S2=OFF) and the low-ohmic impedance path is broken during RF operation (i.e., S2=ON). Additionally, the stacked construction of the two additional switches allows the additional switching time acceleration circuit to withstand the (potentially) high RF voltage applied to any of the two RF terminals of the main switch.

In a second group of embodiments the shunt switch S1 and the series switch S2 both comprise an RF switch with switching time acceleration as shown in FIG. 1B. However, in order to remedy the problems set forth above using a direct substitution of this circuit into the series switch S2, a "shunt-series" switch is also implemented for selectively passing control signals between the shunt switch S1 and the series switch S2. Conceptually, the "shunt-series" switch extends the acceleration branch of the shunt switch towards the series switch during the switching phase of the switch arrangement, treating the joint branch as one single branch, and switching both series and shunt switches into a target state of the series switch and then breaking the path between the acceleration branches of the shunt and series switch for the RF operation phase.

Figure 3:
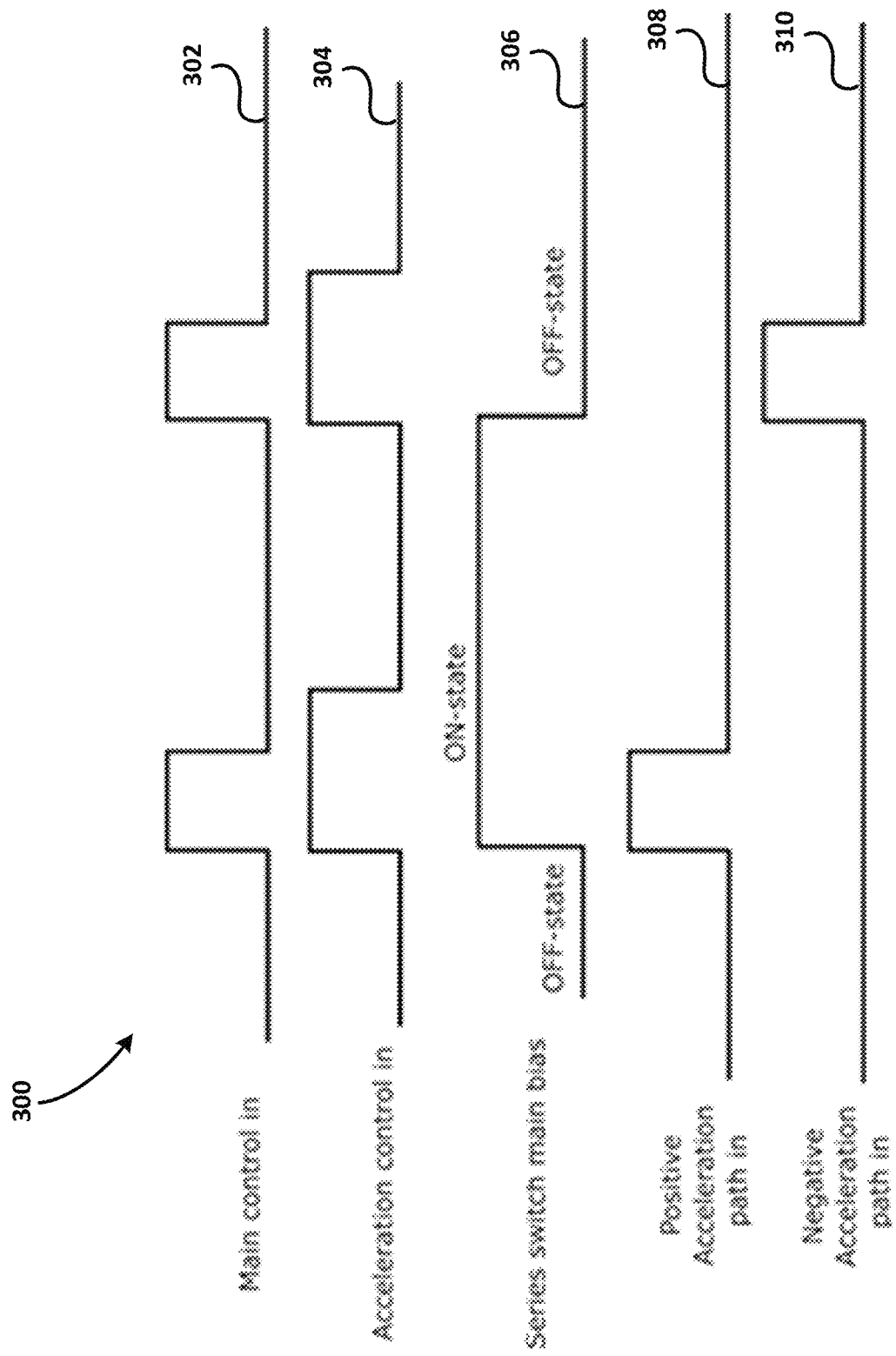
FIG. 3 is a general signal diagram for the RF series switch arrangements with switching time acceleration shown below in FIG. 4A and FIG. 4B.

FIG. 3 is a general signal diagram 300 for the RF series switch arrangements with switching time acceleration shown below in FIG. 4A and FIG. 4B, according to embodiments. General signal diagram 300 shows the main control input waveform 302, the acceleration control input waveform 304, the series switch main bias waveform 306, the positive acceleration path input waveform 308, and the negative acceleration path input waveform 310. The main control input waveform 302 and the acceleration control input waveform 304 are substantially the same as corresponding waveforms for the shunt RF switch 100B shown in FIG. 1B. The positive acceleration path input waveform 308 and the negative acceleration path input waveform 310 are used to selectively enable PMOS and NMOS switches in an additional switching time acceleration circuit that is shown and described below in further detail with respect to FIG. 4A and FIG. 4B.

The RF series switch arrangements discussed in FIG. 4A, FIG. 4B, FIG. 9A, and FIG. 9B all include a series switch coupled between an RF source RF1 and an RF source RF2. In these figures, the series switch is shown in symbolic form, and the actual RF1 and RF2 nodes are not shown at the circuit level. Since the RF series switch arrangements discussed in FIG. 4A, FIG. 4B, FIG. 9A, and FIG. 9B are partially based on the shunt RF switch 100B shown in FIG. 1B. In the shunt switch, the "RF" node corresponds to the "RF2" node, and the ground node corresponds to the "RF1" node.

Figure 4A:
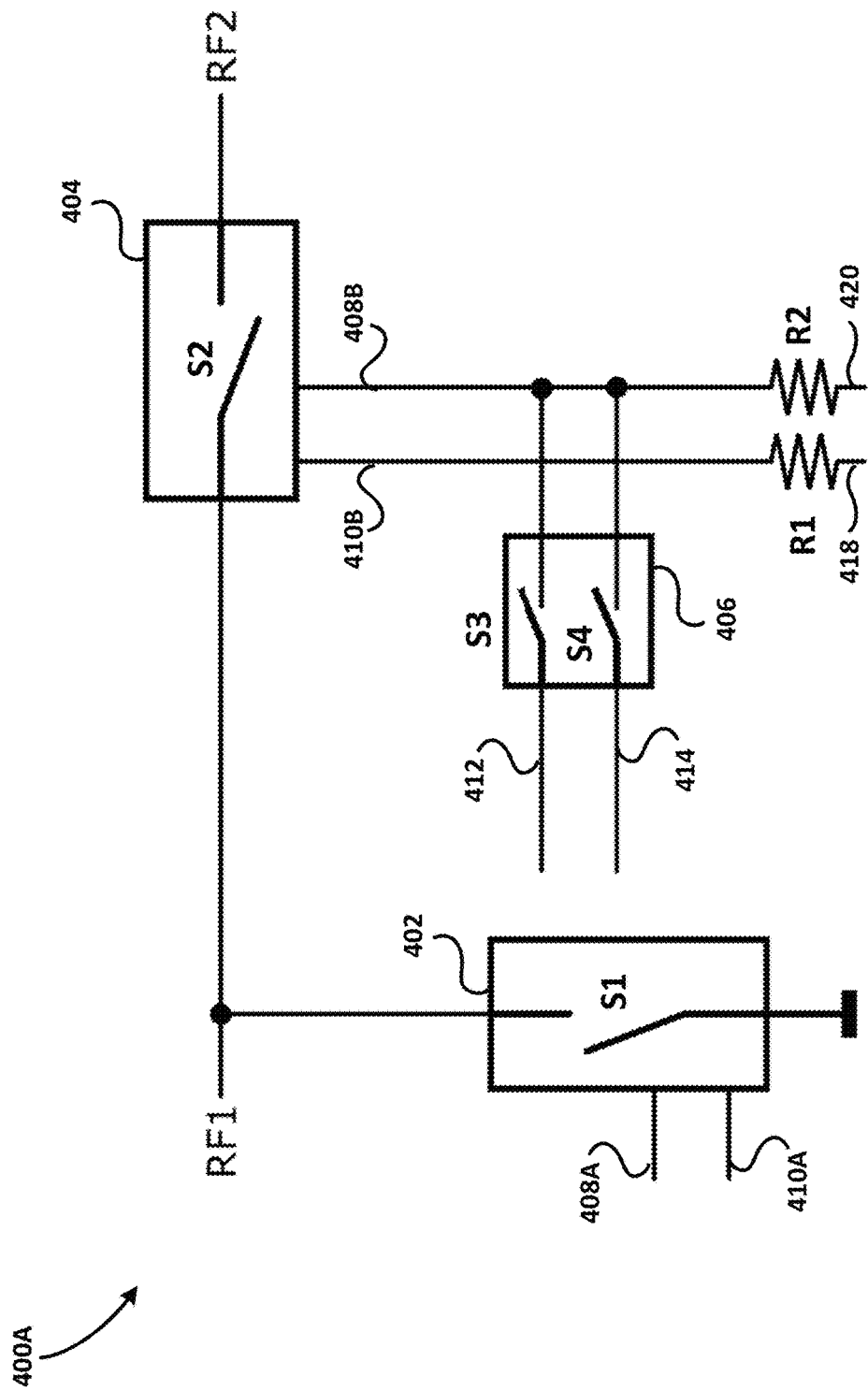
FIG. 4A is a schematic diagram of an RF series switch arrangement with switching time acceleration according to an embodiment.

FIG. 4A is a schematic diagram of an RF series switch arrangement 400A with switching time acceleration according to an embodiment. RF series switch arrangement 400A comprises a series switch 404 (S2), a shunt switch 402 (S1), both of which include switching time acceleration circuitry as previous described, and an additional switching time acceleration circuit 406 including a PMOS switch S3 and an NMOS switch S4 that will be described in further detail below especially with respect to FIG. 5. Shunt switch S1 is coupled between an RF source RF1 and ground, and includes a main control input node 408A, and an acceleration control input node 410A. Series switch S2 is coupled between RF source RF1 and an RF source RF2, and includes a main control input node 408B and an acceleration control input node 410B. RF series switch arrangement 400A also comprises a first bias resistor R1 coupled between series switch acceleration bias node 418 and acceleration control input node 410B, and a second bias resistor R2 coupled between series switch main bias node 420 and main control input node 408B. Additional switching time acceleration circuit 406 includes a positive acceleration path input node 412 coupled to one end of switch S3, and a negative acceleration path input node 414 coupled to one end of switch S4. The control node voltages for switch S3 and switch S4 are described below with respect to FIG. 5 and FIG. 6. The other end of switch S3 and the other end of switch S4 are both coupled to the main control input node 408B. In FIG. 4A additional switching time acceleration circuit 406 is shown as a component separate from the shunt switch S1 and the series switch S2.

Figure 4B:
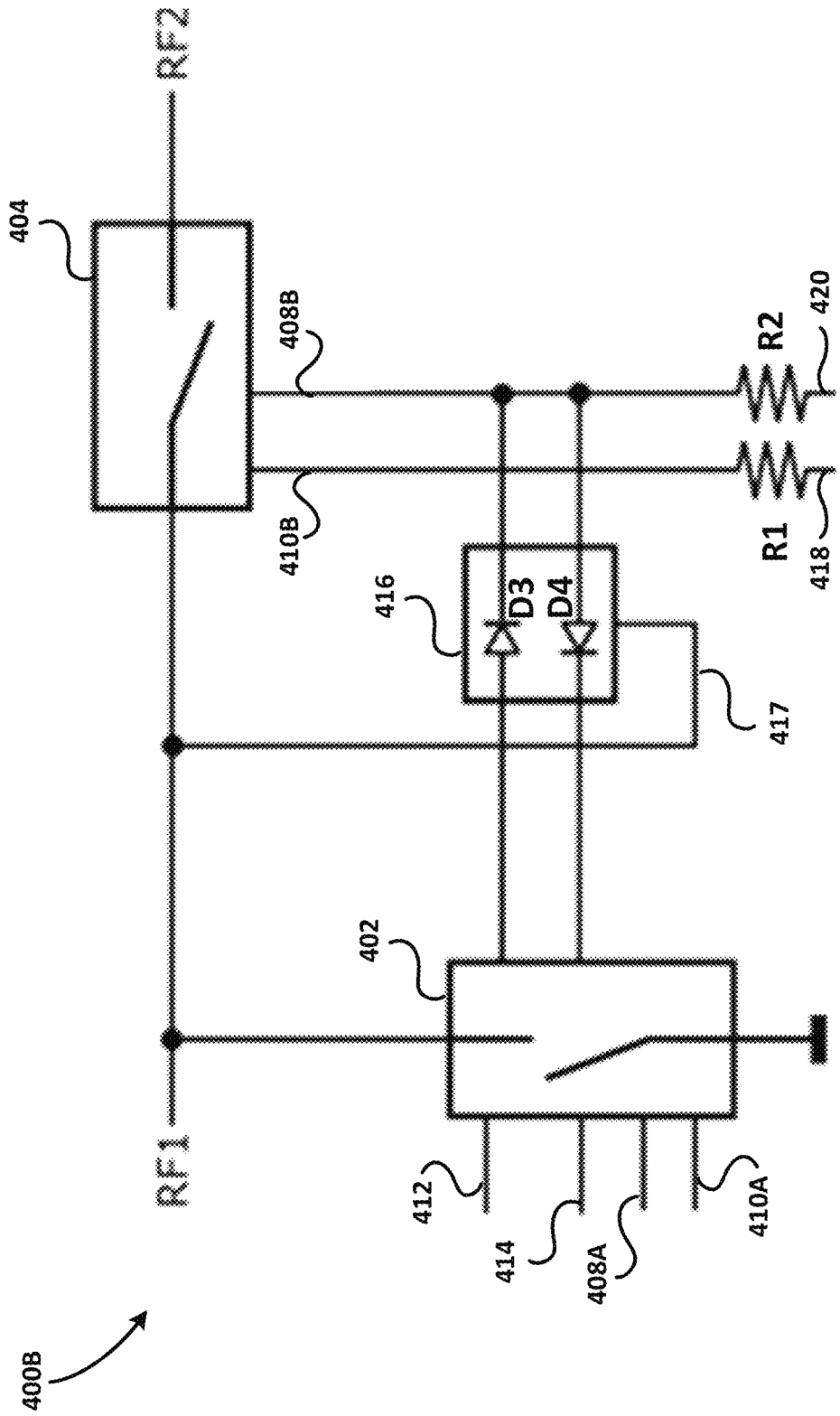
FIG. 4B is a schematic diagram of an RF series switch arrangement with switching time acceleration according to another embodiment.

FIG. 4B is a schematic diagram of an RF series switch arrangement 400B with switching time acceleration according to another embodiment, wherein the additional switching time acceleration circuit 406 is coupled to and merged with the shunt switch S1 for increased high voltage performance as will be explained below with reference to FIG. 7. Thus, shunt switch 402 (S1) includes the positive acceleration path input node 412, the negative acceleration path input node 414, the main control input node 408A, and the acceleration control input node 410A. In addition, the output of switch S3 (merged into shunt switch 402) is coupled to the anode of diode D3 of diode circuit 416, and the output of switch S4 (merged into shunt switch 402) is coupled to the cathode of diode D4 of diode circuit 416. The cathode of diode D3 and the anode of diode D4 are both coupled to the main control input node 408B. Diode circuit 416 can be optionally coupled to RF source RF1, at input 417, to provide a biasing voltage for certain diode implementations best shown in FIG. 8.

In an embodiment, diode D3 and diode D4 of diode circuit 416 are used to overcome implementation challenges related to electrical limitations of real devices used in the circuit implementation of RF series switch arrangement 400B. Particularly, the diodes prevent electrical overstress and stops current flow into one additional switch when the other additional switch is being activated (i.e., switched ON to charge or discharge the main switch).

Figure 5:
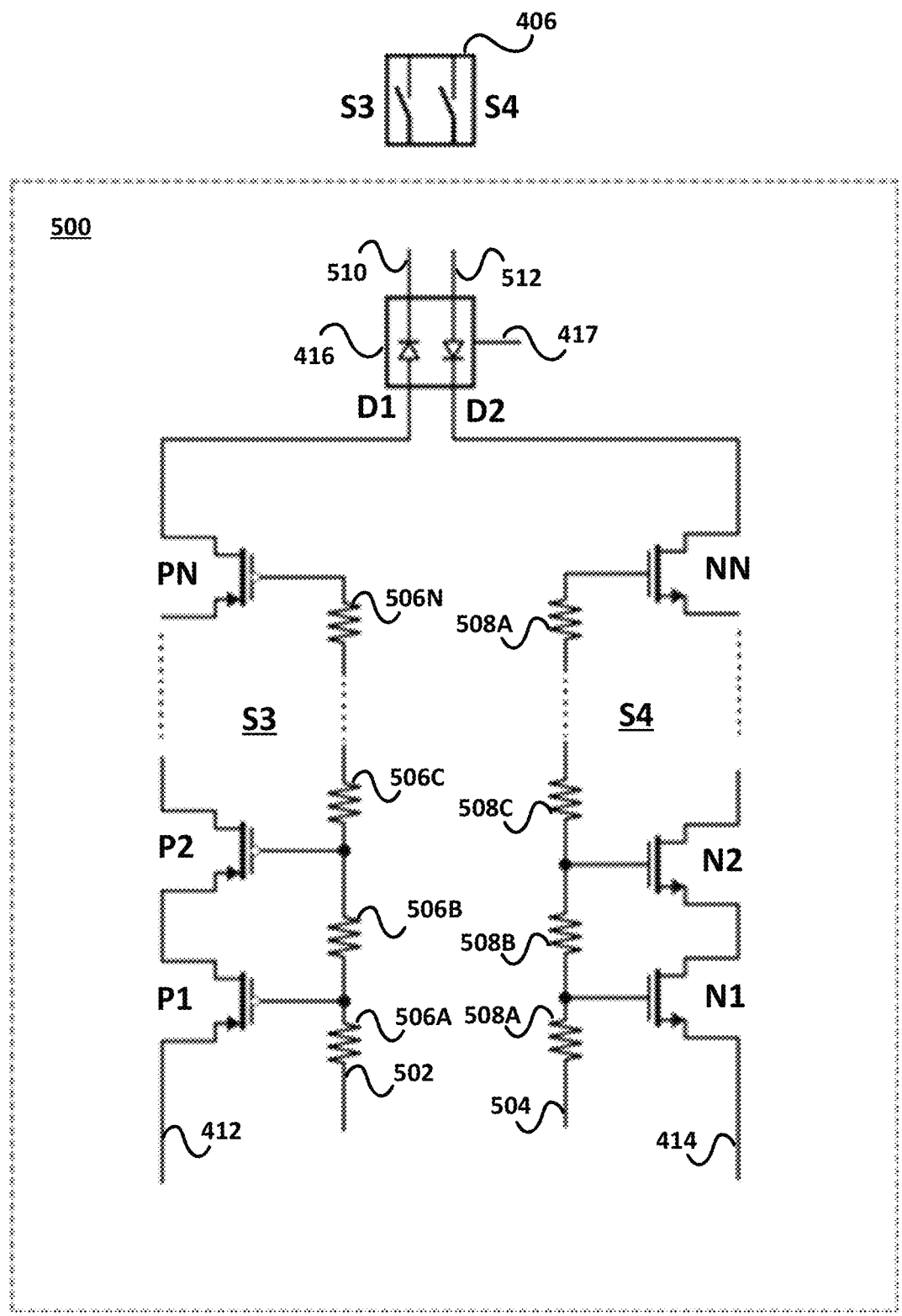
FIG. 5 is a schematic diagram of the additional switching time acceleration circuit for the series switch shown in FIG. 4A and FIG. 4B.

FIG. 5 is a schematic diagram of the additional switching time acceleration circuit 406 for the series switch 404 shown in FIG. 4A and FIG. 4B. The additional switching time acceleration circuit 406 is replicated at the top of FIG. 5 showing switches S3 and S4. Switches S3 and S4 and diode circuit 416 are shown as a combined circuit 500 in FIG. 5. For example, switch S3 comprises a plurality of stacked PMOS transistors P1, P2, . . . , through PN coupled to a corresponding plurality of gate resistors 506A, 506B, 506C, . . . , through 506N. The drain of transistor PN is coupled to the anode of diode D1. The cathode of diode D1 (node 510) is coupled to the main control input node of the series switch 404 as previously discussed. The source of transistor P1 is coupled to the positive acceleration path input node 412. Resistor 506A is coupled to a first gate biasing node 502. Switch S4, in turn, comprises a plurality of stacked NMOS transistors N1, N2, . . . , through NN coupled to a corresponding plurality of gate resistors 508A, 508B, 508C, . . . , through 508N. The drain of transistor NN is coupled to the cathode of diode D2. The anode of diode D2 (node 512) is also coupled to the main control input node of the series switch 404 as previously discussed. The source of transistor N1 is coupled to the negative acceleration path input node 414. Resistor 508A is coupled to a second gate biasing node 504. Diode circuit 416 can be optionally coupled to RF source RF1, at input 417, to provide a biasing voltage as previously described.

Figure 6:
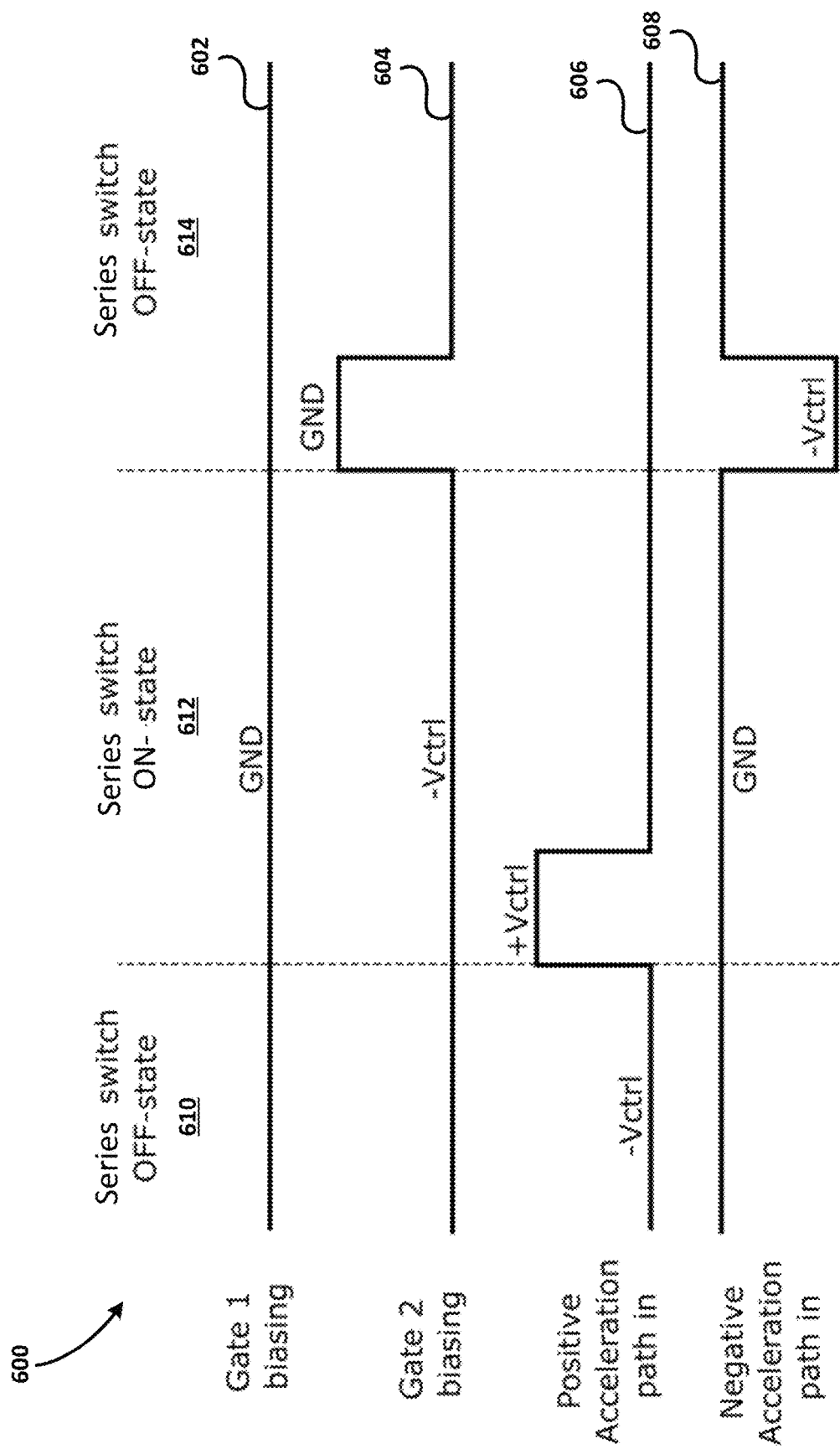
FIG. 6 is a timing diagram with control voltage levels for the switching time acceleration circuit shown in FIG. 5.

FIG. 6 is a timing diagram 600 with control voltage levels for the additional switching time acceleration circuit shown in FIG. 5. Representative waveforms during an initial OFF state 610 of the series switch 404, during an ON state 612 of the series switch 404, and during a subsequent OFF state 614 of the series switch 404 are shown. The representative waveforms are the first gate biasing waveform 602, the second gate biasing waveform 604, the positive acceleration path input waveform 606, and the negative acceleration path input waveform 608. The first gate biasing waveform 602 is set to ground, the second gate biasing waveform 604 includes a single positive-going pulse during the subsequent OFF state 614, the positive acceleration path input waveform 606 includes a single positive-going pulse during the ON state 612, and the negative acceleration path input waveform 608 includes a single negative-going pulse during the subsequent OFF state 614.

The voltage levels used in timing diagram 600 are:
1) GND=ground potential with respect to which all other voltages are defined;
2) −Vctrl=negative voltage with respect to GND, corresponds to the control voltage for the OFF-state switch (−Vctrl is typically in the range of −2V to −4V); and
3) +Vctrl=positive voltage with respect to GND, corresponds to the control voltage for the ON-state switch (+Vctrl is typically in the range of +2V to +4V).

Note that there is a difference between the timing diagram of FIG. 6 and the functional (or logical) timing diagram of FIG. 1C. In FIG. 6 the negative acceleration path is enabled by applying a negative voltage. In FIG. 1C the corresponding signal goes to logical "high" level for enabling the negative acceleration path. The acceleration control in logical "high" level in FIG. 1C shorts all bias resistors of the main switch to enable a fast charge/discharge of the stack. For this reason, the acceleration control is kept "high" for a short period of time after switching into the ON state in order to let all transistors in the stack change their state properly, after which the acceleration control signal goes "low" to disable shorting of the bias resistors.

In summary, without the functional advantages of the switching time acceleration circuit 406 described above the only charge/discharge path for the series switch is resistor R2. Resistor R2 is a high-ohmic resistor that is therefore not able to provide a low-ohmic path for fast switching. Making resistor R2 low-ohmic is not practical for the reason of excessive power loss across the resistor. The additional switching time acceleration circuit provides a low-ohmic impedance path between the positive acceleration path input node 412 and the negative acceleration path input 414 and the main control input of the series switch. The additional switching time acceleration circuit 406 provides the low-ohmic impedance path during the switching phase of the switch arrangement and breaking the low-ohmic impedance path (or in other words providing a high-ohmic impedance path) during RF operation. Additionally, the stacked construction of two additional switches allows the additional switching time acceleration circuit to withstand the (potentially) high RF voltage applied to any of the two RF terminals of the main switch. The series switch can be coupled between RF1 and RF2 and can be biased via R2 without acceleration circuit 406, but the series switch would switch slowly in this hypothetical configuration. An important purpose of the acceleration circuit 406 is to speed up the switching and sustain low RF losses by keeping the value of resistor R2 high.

Figure 7:
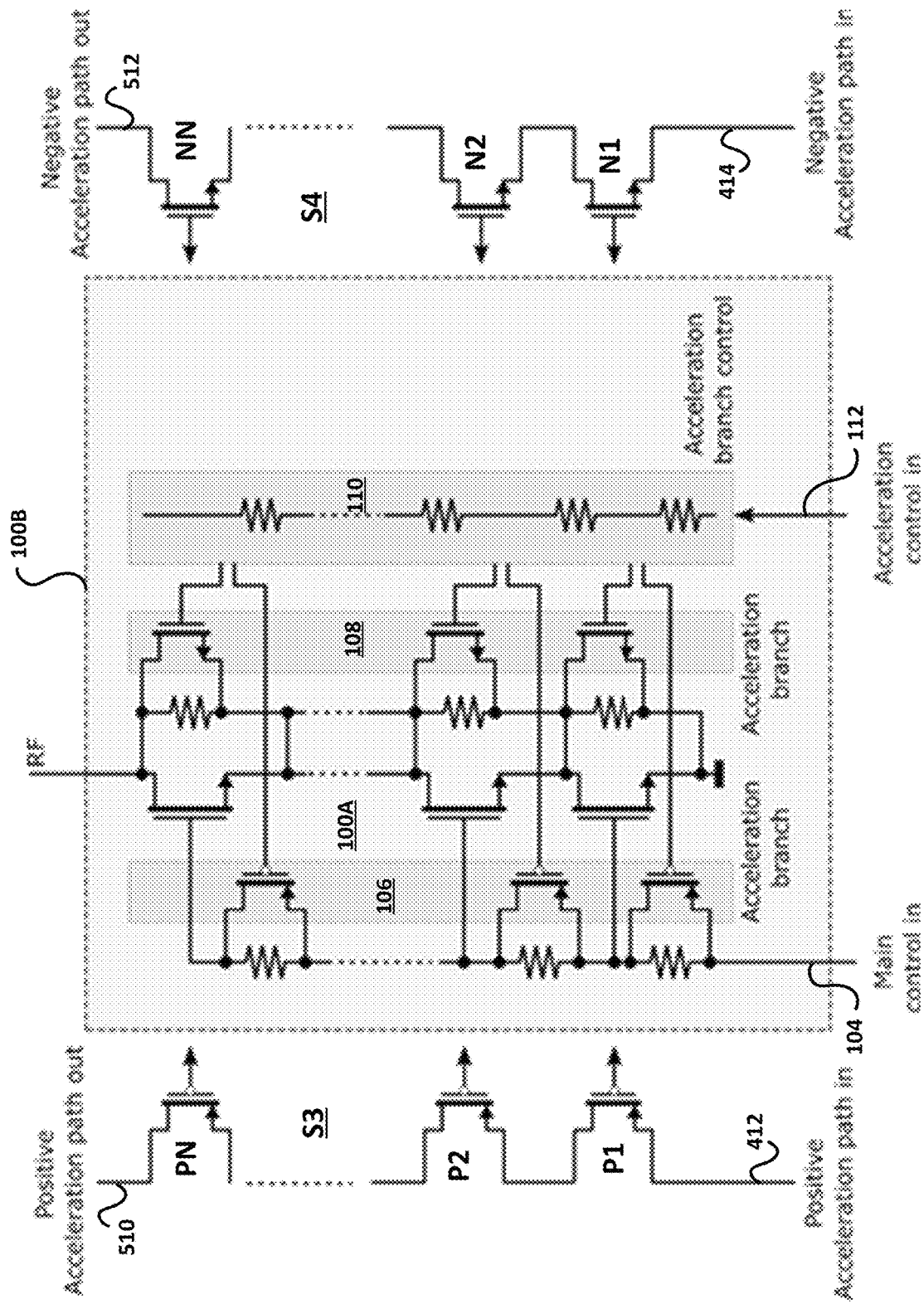
FIG. 7 is a schematic diagram of the switching time acceleration circuit of FIG. 5 coupled to the shunt switch shown in FIG. 1B.

FIG. 7 is a schematic diagram of switches S3 and S4 of the switching time acceleration circuit of FIG. 5 coupled to the shunt RF switch 100B shown in FIG. 1B for the merged implementation shown in FIG. 4B. In particular, switches S3 and S4 are physically coupled to shunt RF switch 100B in that the relative position of the gates of transistors P1, P2, . . . , PN and the gates of transistors N1, N2, . . . , NN are arranged to be in the same relative vertical position as the gates of the stacked transistors in shunt RF switch 100B in an integrated circuit implementation. This arrangement assures that switch performance is enhanced in that problems associated with large voltage gradients are avoided. The arrangement is primarily related to the physical implementation of the circuit. For the sake of efficient and reliable operation of the circuit (meaning, equal RF voltage division in the stack of transistors P1, P2, . . . , PN and N1, N2, . . . , NN devices) the physical implementation implies that P1, P2, . . . , PN and N1, N2, . . . , NN stacks are running in close proximity to the main stack in the same raster with the main stack (same number of stacked devices, each one corresponding to the respective transistor in the main stack).

Figure 8:
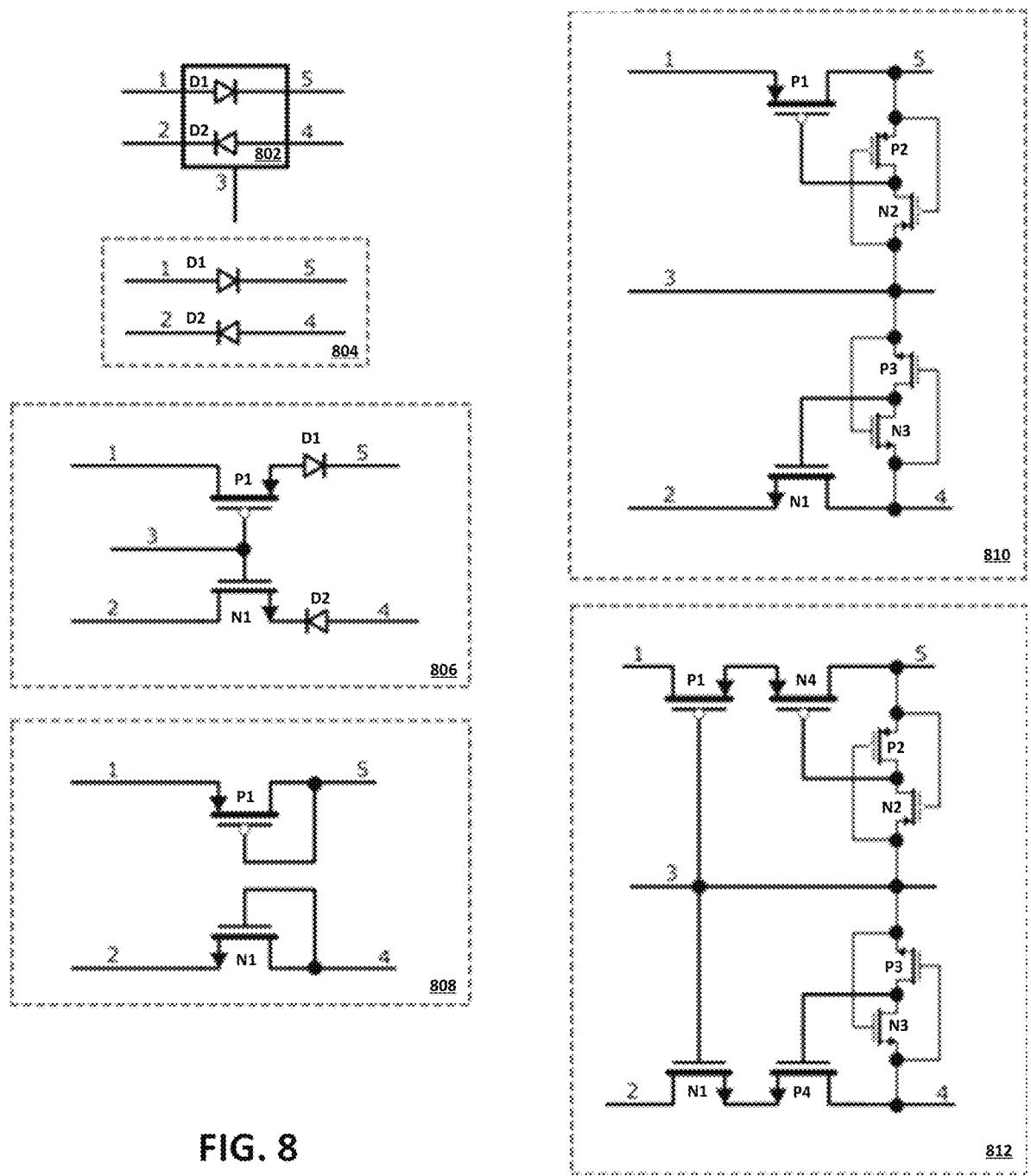
FIG. 8 is a schematic diagram of example blocking diode implementations associated with the switching time acceleration circuit of FIG. 5.

FIG. 8 is a schematic diagram of example blocking diode implementations associated with the switching time acceleration circuit of FIG. 5. A first implementation 802 comprises diode D1 having an anode coupled to node 1 and a cathode coupled to node 5, diode D2 having an anode coupled to node 4 and a cathode coupled to node 2, and an optional bias voltage input coupled to node 3. A second implementation 804 comprises only diodes D1 and D2 without the optional bias voltage input at node 3. A third implementation 806 includes a transistor P1 having a drain coupled to node 1, and a diode D1 having an anode coupled to the source of transistor P1 and a cathode coupled to node 5. Implementation 806 also includes a transistor N1 having a drain coupled to node 2, and a diode D2 having a cathode coupled to the source of transistor N1 and an anode coupled to node 4. The gates of transistors P1 and N1 are coupled to node 3 in implementation 806. A fourth implementation 808 includes transistors P1 and N1 in a diode-connected transistor configuration, and the connection to node 3 is omitted. A fifth implementation 810, in addition to transistors P1 and N1, includes serially-connected transistors P2 and N2 coupled between node 3 and node 5, and transistors P3 and N3 coupled between node 3 and node 4. A sixth implementation 812 includes all of the elements of implementation 810, but in addition includes a transistor N4 having a source coupled to the source of transistor P1, a drain coupled to node 5, and a gate coupled to the junction between transistors P2 and N2. Implementation 812 also includes a transistor P4 having a source coupled to the source of transistor N1, a drain coupled to node 4, and a gate coupled to the junction between transistors P3 and N3.

Figure 9A:
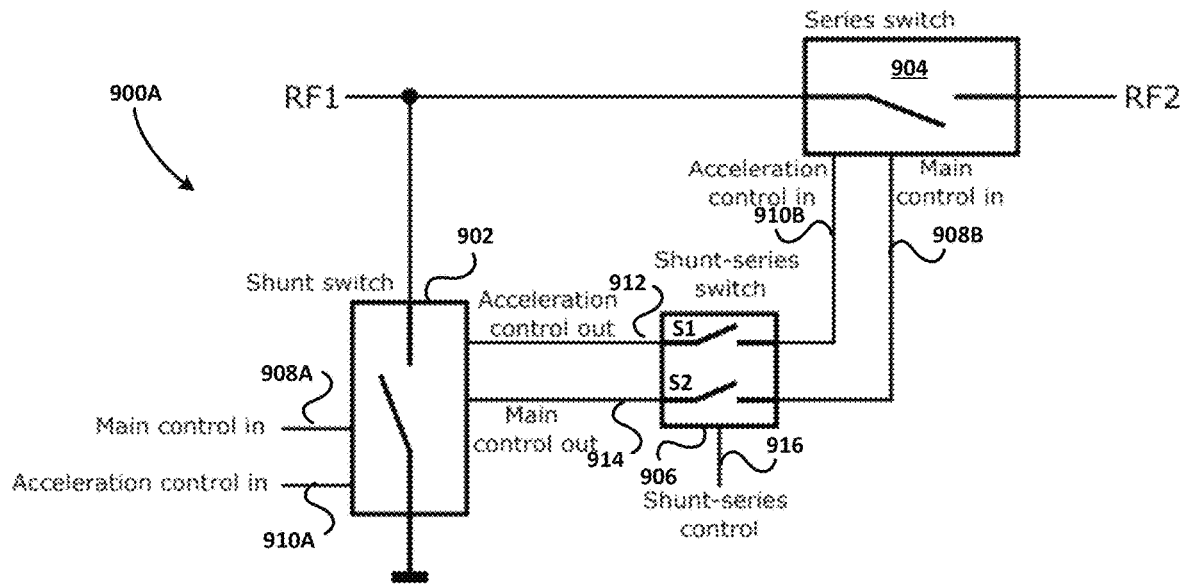
FIG. 9A is a schematic diagram of an RF series switch arrangement including shunt and series switches with switching time acceleration and a shunt-series switch according to an embodiment.
Figure 9B:
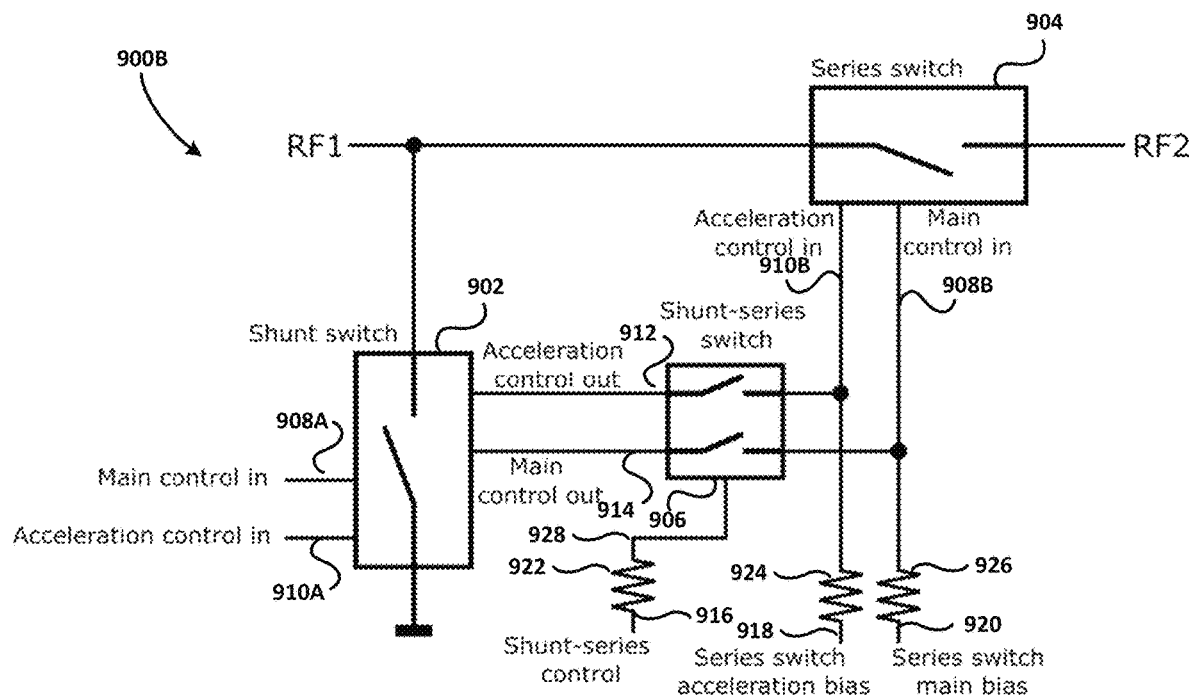
FIG. 9B is a schematic diagram of an RF series switch arrangement including shunt and series switches with switching time acceleration and a shunt-series switch according to another embodiment.

FIG. 9A and FIG. 9B are schematic diagrams of an RF series switch arrangement including shunt and series switches with switching time acceleration and a shunt-series switch according to a second group of embodiments. The shunt and series switches are the same as is shown in FIG. 1B, previously discussed.

FIG. 9A is a schematic diagram of an RF switch arrangement 900A comprising a shunt switch 902 coupled between RF source RF1 and ground, a series switch 904 coupled between RF source RF1 and RF source RF2, and a "shunt-series" switch 906, according to an embodiment. The shunt switch 902 and the series switch 904 each also comprise a main control input node (908A, 908B, respectively) and an acceleration control input node (910A, 910B, respectively) used for controlling the switch state and for speeding up the switching transient. The shunt switch 902 further comprises a main control output node 914 and an acceleration control output node 912. The shunt-series switch 906 is coupled between the main control output node 914 of the shunt switch 902 and the main control input node 908B of the series switch 904, and between the acceleration control output node 912 of the shunt switch 902 and the acceleration control input node 910B of the series switch 904. Shunt-series switch 906 has an input for receiving a shunt-series control signal at shunt-series control node 916. In an embodiment, the shunt-series switch 906 is configured to establish a conductive path during the switching transient and OFF-state operation of the series switch 904 and to the break the conductive path during the ON-state operation of the series switch 904. The operation of RF switch arrangement 900A is described in further detail below with respect to the timing diagram of FIG. 9D, and the flow chart of FIG. 10.

FIG. 9B is a schematic diagram of an RF switch arrangement 900B including all of the components and nodes shown in FIG. 9A. However, in addition to the components shown in FIG. 9A, RF switch arrangement 900B also includes optional resistors 922, 924, and 926.

The RF switch arrangement 900B may additionally comprise a high-ohmic resistive bias network (resistors 924 and 926) coupled to the acceleration control input node 910B and the main control input node 908B of the series switch 904 as shown in FIG. 9B. Resistor 924 is coupled between acceleration control input node 910B and series switch acceleration bias node 918. Resistor 926 is coupled between main control input node 908B and series switch main bias node 920. The high-ohmic resistive bias network serves to sustain a desirable bias voltage at the gates of the main switch and at the control terminals of the acceleration network during RF operation when shunt-series switch 906 is operating in an OFF state and the bias voltage cannot be delivered from the main and acceleration control input terminal. The control voltages at the series switch main and acceleration bias nodes (920, 918) are synchronized with the main control and acceleration control signals as shown in the timing diagram in FIG. 9D and described in further detail below. The value of the high-ohmic resistors 924 and 926 may be in the range of 10 k to 1 MOhm, in some embodiments.

The RF switch arrangement may further comprise an additional high-ohmic resistor 922 coupled between the shunt-series control node 916 and shunt-series switch 906 as is shown in FIG. 9B. Resistor 922 can be used to decouple the shunt-series control voltage source at RF frequencies from the shunt-series control node 916 of the shunt-series switch 906, thus preventing the unwanted power loss or a low-impedance path to ground for the RF signal path (i.e. RF1-RF2) of the switch arrangement. The value of the high-ohmic resistor 922 may be in the range of 10 k to 1 MOhm, in some embodiments.

Figure 9C:
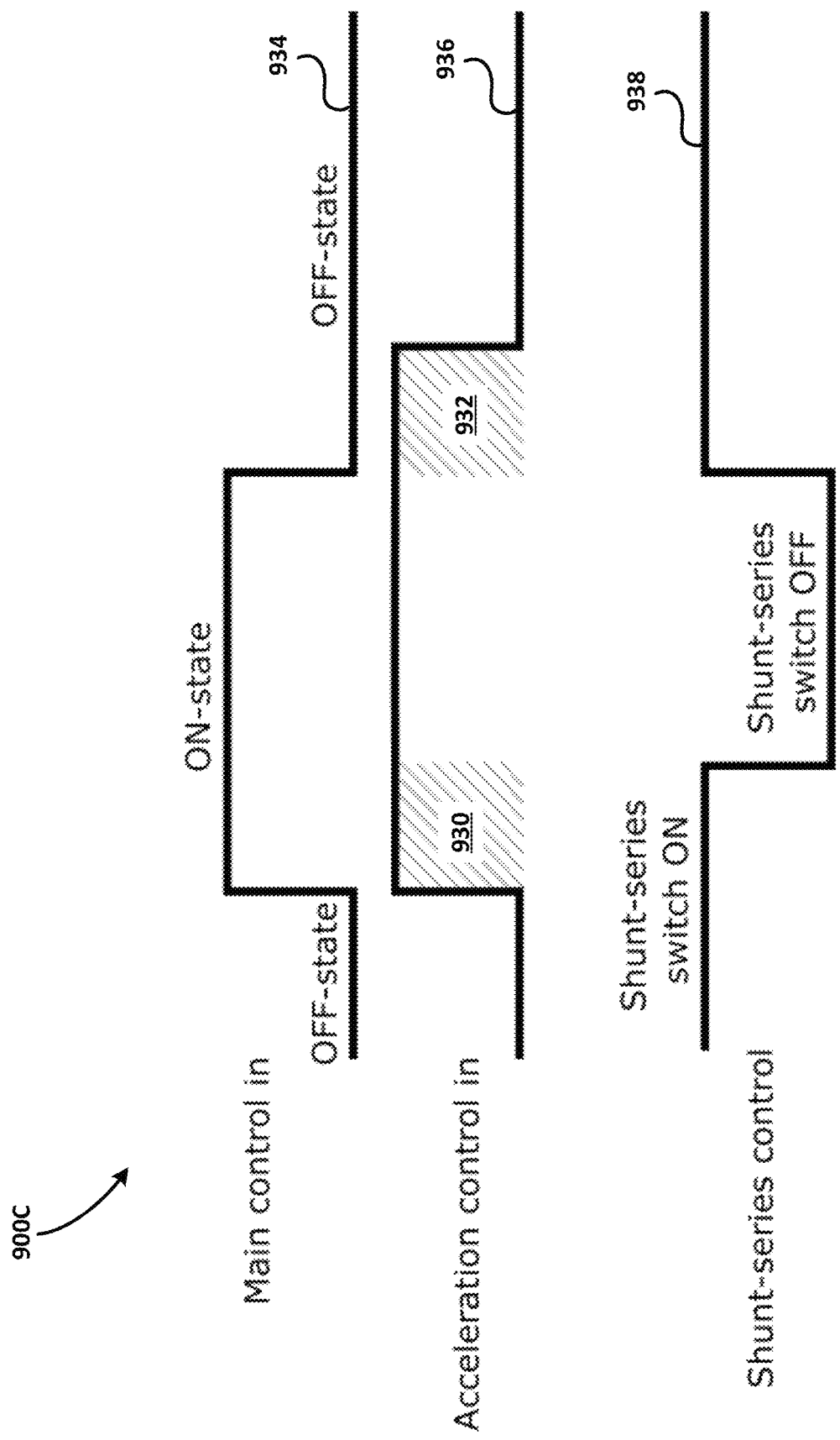
FIG. 9C is a timing diagram associated with the RF series switch arrangements of FIG. 9A and FIG. 9B.

FIG. 9C is a timing diagram 900C associated with the RF series switch arrangements of FIG. 9A and FIG. 9B. The main control input waveform 934 places the RF series switch arrangement into an initial OFF state, an ON state, and to a subsequent OFF state. The acceleration control input waveform 936 includes a first switching transient acceleration 930 associated with the rising edge of the acceleration control input waveform and a second switching transient acceleration 932 associated with the falling edge of the acceleration control input waveform. The acceleration control input waveform 936 is high when the main control input waveform 934 is high and during the second switching transient acceleration 932 time period. The shunt-series control waveform 938 is high except for a time period between the first switching transient acceleration 930 and second switching transient acceleration 932 time periods. The control voltages at the series switch main and acceleration bias nodes (920, 918) are thus synchronized with the main control and acceleration control signals as shown in the timing diagram in FIG. 9C.

In operation, it is assumed that the shunt switch always stays in the OFF state during operation. In order to apply different bias voltages onto the ON-state series switch (meaning, positive bias voltage) and OFF-state shunt switch (negative bias voltage), the shunt-series switch breaks the DC path between the biasing networks of both switches, thus allowing voltages with different levels and polarities to be simultaneously applied to the series and shunt switches during RF operation.

Figure 10:
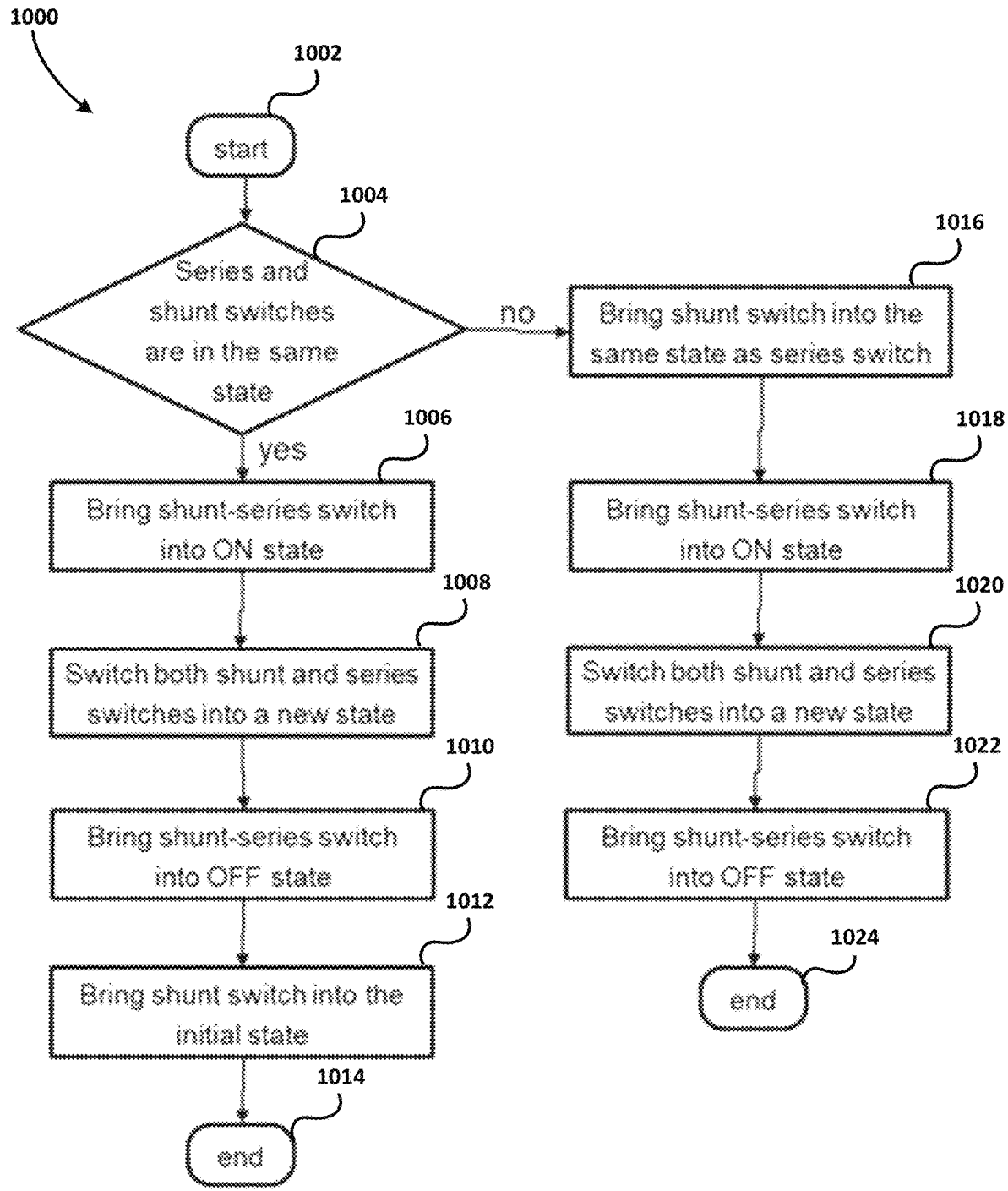
FIG. 10 is a flow chart of a method of operating the RF series switch arrangements of FIG. 9A and FIG. 9B.

FIG. 10 is a flow chart 1000 of a method of operating the RF series switch arrangements of FIG. 9A and FIG. 9B. The method starts at step 1002. At step 1004, the method determines whether or not the series and shunt switches are in the same state. If the answer is yes, then the method continues by bringing the shunt-series switch into the ON state at step 1006. The shunt and series switches are then switched into a new state at step 1008. Subsequently, the shunt-series switch is brought into an OFF state at step 1010. Thereafter, the shunt switch is brought into the initial state at step 1012. The method then ends at step 1014. If the answer to the interrogation of step 1004 is no, the shunt switch is brought into the same state as the series switch at step 1016. The method continues by bringing the shunt-series switch into the ON state at step 1018. The shunt and series switches are then switched into a new state at step 1020. Subsequently, the shunt-series switch is brought into an OFF state at step 1022. The method then ends at step 1024.

Figure 11C:
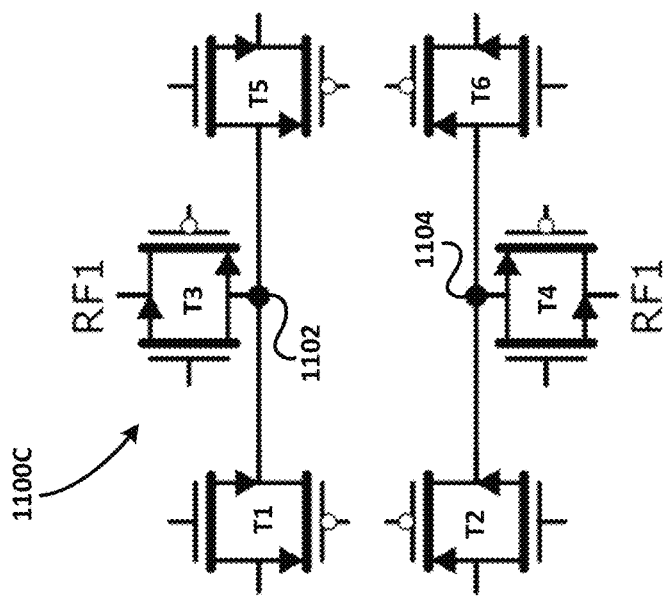
FIG. 11A, FIG. 11B, and FIG. 11C are example embodiments of the shunt-series switch shown in FIG. 9A and FIG. 9B.
Figure 11B:
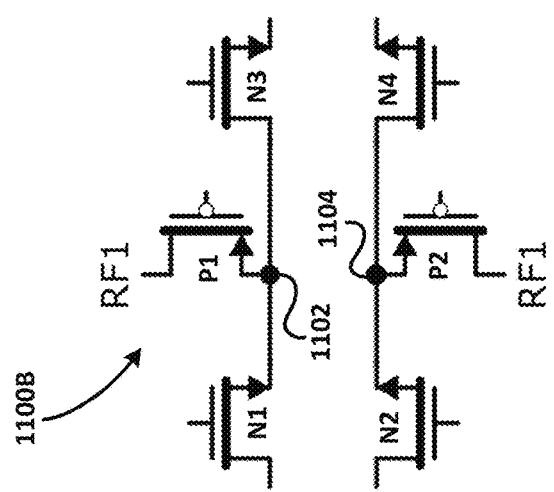
Figure 11A:
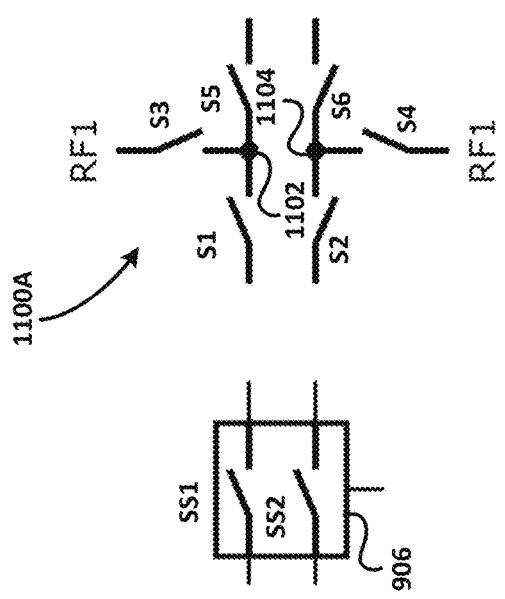

FIG. 11A, FIG. 11B, and FIG. 11C are example embodiments of the shunt-series switch 906 shown in FIG. 9A and FIG. 9B. In the shunt-series switch 906 of FIG. 11, the two individual switches are identified as switch SS1 and switch SS2. Various implementations of switches SS1 and SS2 (as well as the connection to RF source RF1) are shown in FIG. 11A, FIG. 11B, and FIG. 11C, and described below.

The shunt-series switch 906 may be implemented in a form of a T-junction as demonstrated in the switch arrangement 1100A shown in FIG. 11A. Switch SS1 is implemented using individual switches S1, S3, and S5 coupled together at node 1102. Switch SS2 is implemented using individual switches S2, S4, and S6 coupled together at node 1104. The shunt elements of the T-junctions (switch S3, switch S4) may be directly coupled to the RF1 node of the switch arrangement. The purpose of a T-junction is to protect the switches from exceeding a maximum DC voltage difference when the path between the shunt and series switches is not established. In other words, the junction implements a stacked switch structure at DC voltage. Note that the voltage levels at the control node may swing between the negative and positive DC voltages, wherein the DC component at the RF1 pin is close to zero.

The T-junction switch arrangement 1100A shown in FIG. 11A may be implemented using MOS transistors operating in a switching mode as is shown in the switch arrangement 1100B shown in FIG. 11B. Switch SS1 is implemented using transistor switches N1, P1, and N3 coupled together at node 1102. Switch SS2 is implemented using transistor switches N2, P2, and N4 coupled together at node 1104. The PMOS and NMOS devices provide an inverted switching functionality. Each transistor shown in FIG. 11B may be implemented as a series connection of multiple transistor devices if the voltage drop across the terminals exceeds the maximum voltage rating of a single transistor device.

Each of the switch MOSFETs shown in FIG. 11B may additionally comprise a complementary device in parallel with the single switch MOSFET, forming a so-called transmission gate as shown in the switch arrangement 1100C. Such an arrangement may be more suitable for providing a low-ohmic ON-state path for each of the two signal branches, thus further speeding up the switching acceleration. In particular, switch SS1 comprises transmission gates T1, T3, and T5 coupled together at node 1102. Switch SS2 comprises transmission gates T2, T4, and T6 coupled together at node 1104.

Figure 12:
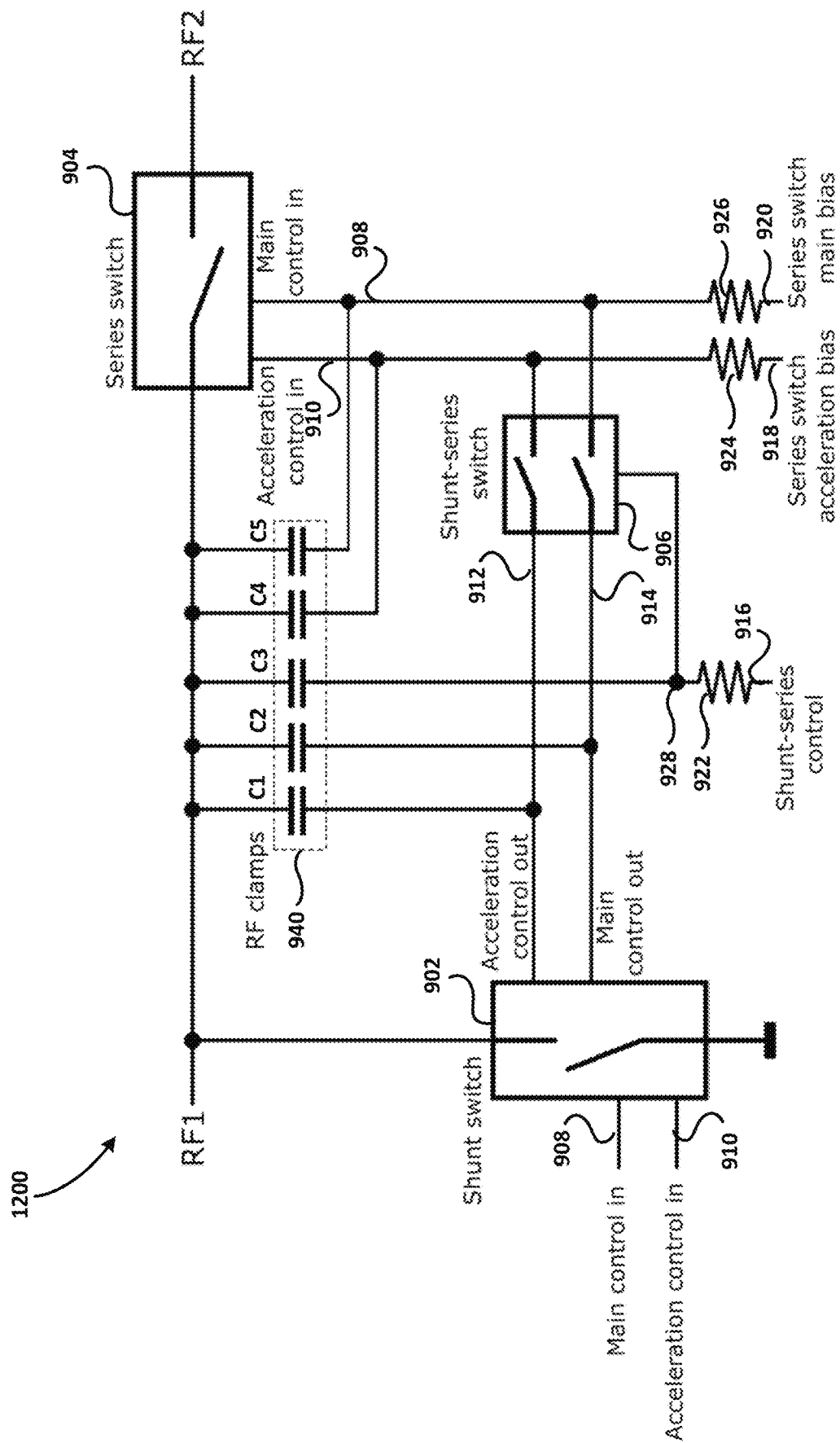
FIG. 12 is a schematic diagram of an RF series switch arrangement including shunt and series switches with switching time acceleration, a shunt-series switch, and a plurality of RF clamps, according to an embodiment.

FIG. 12 is a schematic diagram of an RF series switch arrangement 1200 including shunt and series switches with switching time acceleration, a shunt-series switch, and a plurality of RF clamps, according to an embodiment. The RF series switch arrangement 1200 is substantially the same as the RF switch arrangement 900B shown in FIG. 9B and previously described, except for the plurality of RF clamps, which are described in detail below.

The plurality of RF clamps 940 comprise a plurality of capacitors C1, C2, C3, C4, and C5, in an embodiment. While five such capacitor clamps are shown in FIG. 12, additional or fewer such clamps may be used. Capacitor C1 is coupled between RF1 (RF source RF1) and acceleration control output node 912, capacitor C2 is coupled between RF1 and main control output node 914, capacitor C3 is coupled between RF1 and node 928, capacitor C4 is coupled between RF1 and node 910, and capacitor C5 is coupled between RF1 and node 908, in an embodiment.

The RF clamps provide a low-impedance path between the RF node RF1 and the control nodes of the shunt-series switch, as shown in FIG. 12. The purpose of each clamp is to keep the AC voltage at the control terminals equal or close to the AC voltage at RF1 node to protect them from damage when the switch arrangement 1200 is driven by a high power RF signal. The RF clamps may be implemented in a form of a linear capacitor with value ranging between typically 10 fF and 100 fF.

Example embodiments of the present invention are summarized here. Other embodiments can also be understood from the entirety of the specification and the claims filed herein.

Example 1. According to an embodiment, an RF switch arrangement comprises a shunt switch having a first RF terminal, a second RF terminal coupled to ground, a main control input, and an acceleration control input; a series switch having a first RF terminal coupled to the first RF terminal of the shunt switch, a second RF terminal, a main control input, and an acceleration control input; and a switching time acceleration circuit having a positive acceleration path input, a negative acceleration path input, and a first output coupled to the main control input of the series switch.

Example 2. The RF switch arrangement of Example 1, wherein the switching time acceleration circuit comprises a third switch coupled between the positive acceleration path input and the first output.

Example 3. The RF switch arrangement of any of the above examples, wherein the third switch comprises a plurality of stacked PMOS transistors.

Example 4. The RF switch arrangement of any of the above examples, wherein the switching time acceleration circuit comprises a second output coupled to the main control input of the series switch, and wherein the switching time acceleration circuit comprises a fourth switch coupled between the negative acceleration path input and the second output.

Example 5. The RF switch arrangement of any of the above examples, wherein the fourth switch comprises a plurality of stacked NMOS transistors.

Example 6. The RF switch arrangement of any of the above examples, further comprising a diode circuit coupled to the third switch and to the fourth switch.

Example 7. According to an embodiment, an RF switch arrangement comprises a shunt switch having a first RF terminal, a second RF terminal coupled to ground, a main control input, a main control output, an acceleration control input, and an acceleration control output; a series switch having a first RF terminal coupled to the first RF terminal of the shunt switch, a second RF terminal, a main control input, and an acceleration control input; and a shunt-series switch coupled between the main control output of the shunt switch and the main control input of the series switch, and coupled between the acceleration control output of the shunt switch and the acceleration control input of the series switch.

Example 8. The RF switch arrangement of Example 7, wherein the shunt-series switch is configured to establish a conductive path during a switching transient and an OFF-state operational mode of the series switch and configured to break the conductive path during an ON-state operational mode of the series switch.

Example 9. The RF switch arrangement of any of the above examples, wherein the shunt-series switch further comprises a shunt-series control node.

Example 10. The RF switch arrangement of any of the above examples, wherein the shunt-series switch comprises a first T-junction switch arrangement and a second T-junction switch arrangement.

Example 11. The RF switch arrangement of any of the above examples, wherein the first T-junction switch arrangement and the second T-junction switch arrangement each comprise first and second NMOS transistors coupled to a PMOS transistor.

Example 12. The RF switch arrangement of any of the above examples, wherein the first T-junction switch arrangement and the second T-junction switch arrangement each comprise first and second NMOS transmission gates coupled to a PMOS transmission gate.

Example 13. According to an embodiment, a method of operating an RF switch arrangement, wherein the RF switch arrangement comprises a series switch including a first switching time acceleration circuit, a shunt switch including a second switching time acceleration circuit, and a shunt-series switch for selectively coupling the series switch to the shunt switch, wherein the method comprises establishing a conductive path during a switching transient and an OFF-state operational mode of the series switch; and breaking the conductive path during an ON-state operational mode of the series switch.

Example 14. The method of Example 13 further comprising interrogating the RF switch arrangement to determine whether or not the series switch and the shunt switch are in a same state.

Example 15. The method of any of the above examples, wherein, if the series switch and the shunt switch are in the same state, the method further comprises placing the shunt-series switch into an ON state; switching the shunt switch and the series switch into a new state; placing the shunt-series switch into an OFF state; and placing the shunt switch into an initial state.

Example 16. The method of any of the above examples, wherein, if the series switch and the shunt switch are not in the same state, the method further comprises placing the shunt switch into a same state as the series switch.

Example 17. The method of any of the above examples, wherein the method further comprises placing the shunt-series switch into an ON state; switching the shunt switch and the series switch into a new state; and placing the shunt-series switch into an OFF state.

Example 18. The method of any of the above examples further comprising clamping at least one circuit node of the RF switch arrangement to a first RF source.

Example 19. The method of any of the above examples further comprising coupling the shunt switch between a first RF source and ground.

Example 20. The method of any of the above examples further comprising coupling the series switch between a first RF source and a second RF source.

Example 21. The RF switch arrangement of Example 1, wherein the shunt switch comprises a first plurality of stacked transistors, wherein the switching time acceleration circuit comprises a second plurality of stacked transistors and a third plurality of stacked transistors, and wherein the second plurality of stacked transistors are in physical proximity to the first plurality of stacked transistors and have a same raster configuration.

Example 22. The RF switch arrangement of any of the above examples, wherein the third plurality of stacked transistors are in physical proximity to the first plurality of stacked transistors and have a same raster configuration.

Example 23. The RF switch arrangement of any of the above examples, further comprising a diode circuit coupled between the shunt switch and the series switch.

Example 24. The RF switch arrangement of any of the above examples, wherein the diode circuit comprises a pair of anti-parallel diodes.

Example 25. The RF switch arrangement of any of the above examples, wherein the diode circuit further comprises a biasing voltage input.

Example 26. The RF switch arrangement of any of the above examples, wherein the diode circuit comprises a PMOS transistor having a source coupled to a first diode and a gate coupled to a biasing voltage input, and wherein the diode circuit comprises an NMOS transistor having a source coupled to a second diode and a gate coupled to the biasing voltage input.

Example 27. The RF switch arrangement of any of the above examples, wherein the diode circuit comprises a pair of diode-connected transistors.

Example 28. The RF switch arrangement of any of the above examples, wherein the diode circuit comprises a first PMOS transistor; a first NMOS transistor; a second PMOS transistor and a second NMOS transistor coupled between a drain of the first PMOS transistor and a biasing voltage input; and a third PMOS transistor and a third NMOS transistor coupled between a drain of the first NMOS transistor and the biasing voltage input.

Example 29. The RF switch arrangement of any of the above examples, wherein the diode circuit comprises a first PMOS transistor coupled to a fourth NMOS transistor; a first NMOS transistor coupled to a fourth PMOS transistor; a second PMOS transistor and a second NMOS transistor coupled between a drain of the fourth NMOS transistor and a biasing voltage input; and a third PMOS transistor and a third NMOS transistor coupled between a drain of the fourth PMOS transistor and the biasing voltage input.

Example 30. The RF switch arrangement of any of the above examples, wherein the first plurality of transistors comprises a plurality of NMOS transistors, wherein the second plurality of transistors comprises a plurality of PMOS transistors, and wherein the third plurality of transistors comprises a plurality of NMOS transistors.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An RF switch arrangement comprising:
   a shunt switch having a first RF terminal, a second RF terminal coupled to ground, a main control input, and an acceleration control input;
   a series switch having a first RF terminal coupled to the first RF terminal of the shunt switch, a second RF terminal, a main control input, and an acceleration control input; and
   a switching time acceleration circuit having a positive acceleration path input, a negative acceleration path input, and a first output coupled to the main control input of the series switch.

2. The RF switch arrangement of claim 1, wherein the switching time acceleration circuit comprises a third switch coupled between the positive acceleration path input and the first output.

3. The RF switch arrangement of claim 2, wherein the third switch comprises a plurality of stacked PMOS transistors.

4. The RF switch arrangement of claim 2, wherein the switching time acceleration circuit comprises a second output coupled to the main control input of the series switch, and wherein the switching time acceleration circuit comprises a fourth switch coupled between the negative acceleration path input and the second output.

5. The RF switch arrangement of claim 4, wherein the fourth switch comprises a plurality of stacked NMOS transistors.

6. The RF switch arrangement of claim 4, further comprising a diode circuit coupled to the third switch and to the fourth switch.

7. An RF switch arrangement comprising:
   a shunt switch having a first RF terminal, a second RF terminal coupled to ground, a main control input, a main control output, an acceleration control input, and an acceleration control output;
   a series switch having a first RF terminal coupled to the first RF terminal of the shunt switch, a second RF terminal, a main control input, and an acceleration control input; and
   a shunt-series switch coupled between the main control output of the shunt switch and the main control input of the series switch, and coupled between the acceleration control output of the shunt switch and the acceleration control input of the series switch.

8. The RF switch arrangement of claim 7, wherein the shunt-series switch is configured to establish a conductive path during a switching transient and an OFF-state operational mode of the series switch and configured to break the conductive path during an ON-state operational mode of the series switch.

9. The RF switch arrangement of claim 7, wherein the shunt-series switch further comprises a shunt-series control node.

10. The RF switch arrangement of claim 7, wherein the shunt-series switch comprises a first T-junction switch arrangement and a second T-junction switch arrangement.

11. The RF switch arrangement of claim 10, wherein the first T-junction switch arrangement and the second T-junction switch arrangement each comprise first and second NMOS transistors coupled to a PMOS transistor.

12. The RF switch arrangement of claim 10, wherein the first T-junction switch arrangement and the second T-junction switch arrangement each comprise first and second NMOS transmission gates coupled to a PMOS transmission gate.

13. A method of operating an RF switch arrangement, wherein the RF switch arrangement comprises a series switch including a first switching time acceleration circuit, a shunt switch including a second switching time acceleration circuit, and a shunt-series switch for selectively coupling the series switch to the shunt switch, the method comprising:
   establishing a conductive path during a switching transient and an OFF-state operational mode of the series switch;
   breaking the conductive path during an ON-state operational mode of the series switch; and
   coupling the series switch between a first RF source and a second RF source.

14. The method of claim 13 further comprising interrogating the RF switch arrangement to determine whether or not the series switch and the shunt switch are in a same state.

15. The method of claim 14, wherein, if the series switch and the shunt switch are in the same state, the method further comprises:
   placing the shunt-series switch into an ON state;
   switching the shunt switch and the series switch into a new state;
   placing the shunt-series switch into an OFF state; and
   placing the shunt switch into an initial state.

16. The method of claim 14, wherein, if the series switch and the shunt switch are not in the same state, the method further comprises placing the shunt switch into a same state as the series switch.

17. The method of claim 16, wherein the method further comprises:
   placing the shunt-series switch into an ON state;
   switching the shunt switch and the series switch into a new state; and
   placing the shunt-series switch into an OFF state.

18. The method of claim 13 further comprising clamping at least one circuit node of the RF switch arrangement to the first RF source.

19. The method of claim 13 further comprising coupling the shunt switch between the first RF source and ground.

20. The method of claim 13, wherein the shunt-series switch comprises a shunt-series control node for receiving a shunt-series control signal.

* * * * *